United States Patent

Polcyn et al.

(10) Patent No.: US 9,188,723 B2
(45) Date of Patent: Nov. 17, 2015

(54) PATTERNS ON GLASS FOR INCREASED LIGHT TRANSMISSION AND/OR LIGHT TRAPPING

(71) Applicant: PPG INDUSTRIES OHIO, INC., Cleveland, OH (US)

(72) Inventors: Adam D. Polcyn, Pittsburgh, PA (US); Pal Koppa, Budaors (HU); Szabolcs Beleznai, Gyula (HU)

(73) Assignee: PPG industries Ohio, Inc., Cleveland, OH (US)

( * ) Notice: Subject to any disclaimer, the term of this patent is extended or adjusted under 35 U.S.C. 154(b) by 247 days.

(21) Appl. No.: 13/892,340

(22) Filed: May 13, 2013

(65) Prior Publication Data

US 2014/0268331 A1 Sep. 18, 2014

Related U.S. Application Data

(60) Provisional application No. 61/781,678, filed on Mar. 14, 2013.

(51) Int. Cl.
    *G02B 5/30* (2006.01)
    *H01L 31/0236* (2006.01)
    *H01L 31/048* (2014.01)

(52) U.S. Cl.
    CPC ........ *G02B 5/3066* (2013.01); *H01L 31/02366* (2013.01); *H01L 31/048* (2013.01); *Y02E 10/50* (2013.01)

(58) Field of Classification Search
    CPC ...... G02B 5/0278; G02B 5/20; G02B 6/0053; G02B 5/3066; H01L 31/054; H01L 31/048
    USPC ................. 359/485, 483, 488, 489
    See application file for complete search history.

(56) References Cited

U.S. PATENT DOCUMENTS

| | | |
|---|---|---|
| 4,913,520 A | 4/1990 | Kafka |
| 4,913,529 A | 4/1990 | Goldenberg et al. |
| 5,559,634 A | 9/1996 | Weber |
| 5,594,830 A | 1/1997 | Winston et al. |

(Continued)

FOREIGN PATENT DOCUMENTS

| | | |
|---|---|---|
| EP | 2058866 A2 | 5/2009 |
| WO | 97/19473 A1 | 5/1997 |

(Continued)

OTHER PUBLICATIONS

International Search Report, PCT/US2014/026977, dated Jul. 16, 2014.
Campbell et al; Light trapping properties of pyramidally textured surfaces; J. Appl. Phys. 62(1), Jul. 1, 1987; 1987 American Institute of Physics; pp. 243-249.
Tobin et al.; Experimental Comparison of Light-Trapping Structures for Silicon Solar Cells;1988 IEEE; pp. 545-548; Bedford, MA.

(Continued)

*Primary Examiner* — Stephone B Allen
*Assistant Examiner* — Rahman Abdur
(74) *Attorney, Agent, or Firm* — Andrew C. Siminerio

(57) ABSTRACT

In one non-limiting embodiment, a transparency for use as a cover plate for a solar collector, window and/or room divider includes a major surface of a glass substrate having Brewster tetrahedrons to convert s-polarized light waves to converted p-polarized light waves to reduce the percent of light wave reflectance of the substrate. In another non-limiting embodiment, the transparency includes a major surface of the substrate having pyramidal tetrahedrons to capture light waves within the body of the substrate to reduce the percent of visible light reflection.

18 Claims, 8 Drawing Sheets

(56) References Cited

U.S. PATENT DOCUMENTS

| | | | |
|---|---|---|---|
| 5,640,480 A | 6/1997 | Komine | |
| 5,696,627 A * | 12/1997 | Benson et al. | 359/529 |
| 6,473,220 B1 * | 10/2002 | Clikeman et al. | 359/247 |
| 7,368,655 B2 * | 5/2008 | Blieske et al. | 136/246 |
| 2009/0266407 A1 | 10/2009 | Harder et al. | |
| 2010/0051093 A1 | 3/2010 | Harder et al. | |
| 2010/0229920 A1 * | 9/2010 | Hong et al. | 136/246 |
| 2012/0282437 A1 | 11/2012 | Clark et al. | |
| 2013/0344642 A1 | 12/2013 | Gayout et al. | |

FOREIGN PATENT DOCUMENTS

| | | |
|---|---|---|
| WO | 2005111670 A1 | 11/2005 |
| WO | 2011121067 A2 | 10/2011 |

OTHER PUBLICATIONS

Scheydecker et al.; Reduction of Reflection Losses of PV-Modules by Structured Surfaces; Solar Energy, vol. 53, No. 2, pp. 171-176, 1994.

Thorp et al; Ray-tracing of arbitrary surface textures for light-trapping in thin silicon solar cells; Solar Energy Materials and Solar Cells 48 (1997); pp. 295-301.

Blieske et al.; Light-Trapping in Solar Modules Using Extra-White Textured Glass; 3rd World Conference on Photovoltaic Energy Conversion; May 11-18, 2003; Osaka, Japan; 4 pages.

Doege et al; Textured Glass Increases Light Transmission in Solar Modules; the GlassResearcher vol. 12 Nos. 1 & 2; pp. 5-7.

\* cited by examiner

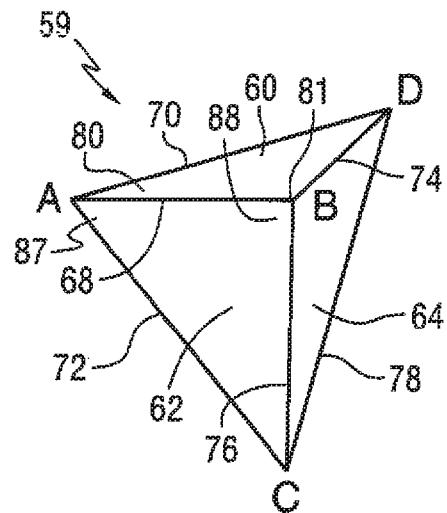
FIG. 5
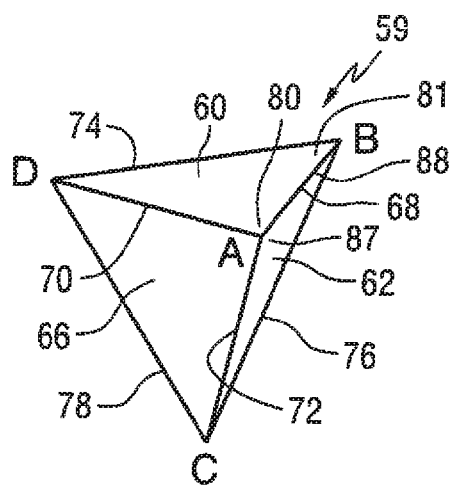
FIG. 6
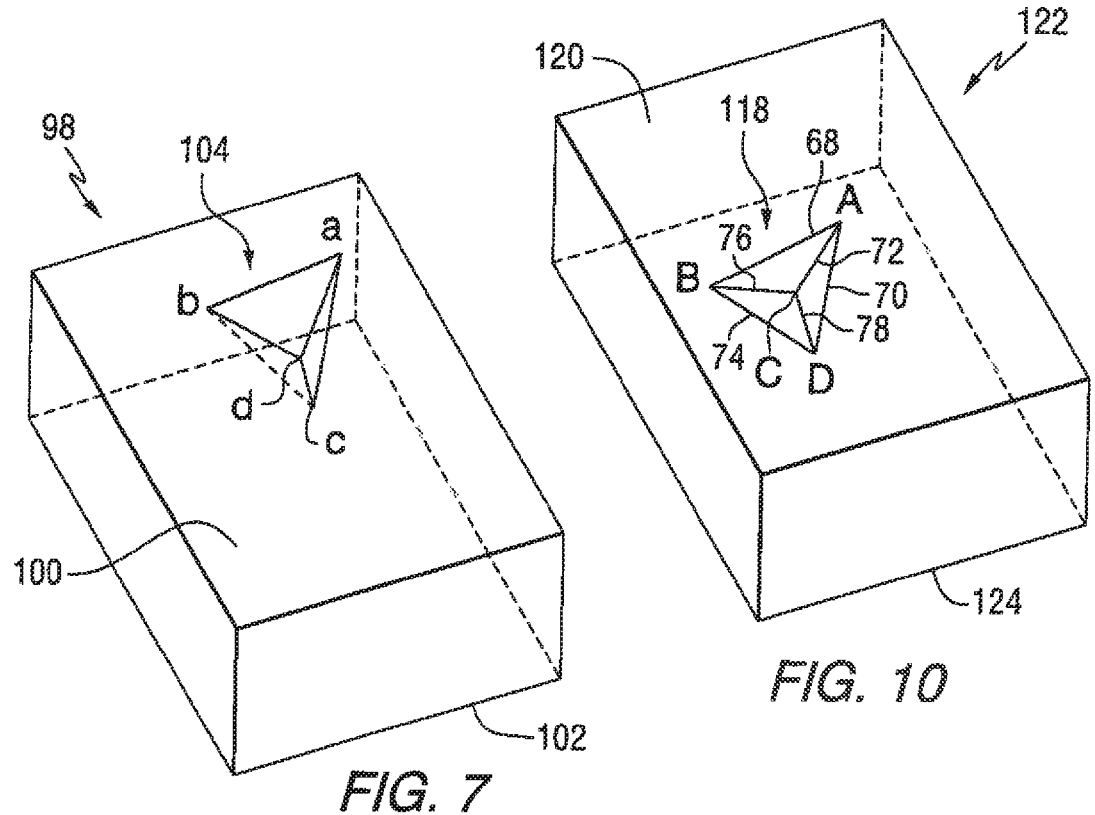
FIG. 7
FIG. 10

PATTERNS ON GLASS FOR INCREASED LIGHT TRANSMISSION AND/OR LIGHT TRAPPING

CROSS REFERENCE TO RELATED PATENT APPLICATION

This application claims the benefits of U.S. Provisional Patent Application Ser. No. 61/781,678 filed Mar. 14, 2013 and titled "Patterns On Glass For Increased Light Transmission And/Or Light Trapping". Application Ser. No. 61/781,678 in its entirety is hereby incorporated herein by reference.

BACKGROUND OF THE INVENTION

1. Field of the Invention

This invention relates to patterns on a transparent substrate, e.g. a glass substrate to increase light transmission and/or light trapping, and more particularly, to patterns on a glass cover plate of a solar cell to convert s-polarized light wave to p-polarized light wave to increase transmission of light waves through the cover plate, and/or to trap internally reflected light waves, to increase electrical output of the solar cell.

2. Discussion of the Present Technology

At the present time solar cells include a transparent cover plate, e.g. a glass cover plate over a mono-crystalline silicon photovoltaic module. The cover plate protects the module against a hostile environment, e.g. rain, snow, and wind blown debris, e.g. wind blown dust and stones, while passing solar energy through the cover plate to the module. Although the use of transparent cover plates is acceptable, there are limitations. More particularly and with exception, the solar energy is incident on the glass cover plate as non-polarized collimated light waves. As is appreciated by those skilled in the art, when the non-polarized light waves are incident on the outer surface of the glass cover plate at a Brewster-angle the non-polarized light waves become polarized light waves with the p-polarized light waves having an electric field parallel to the plane of incidence passing thought the glass cover plate, and the s-polarized light waves having an electric field perpendicular to the plane of incidence partly reflected away from the glass cover plate and the photovoltaic module.

Technology is available, e.g. as disclosed in U.S. Pat. Nos. 4,913,520; 5,559,634; 5,594,830 and 5,640,480 to convert s-polarized light waves reflected from a glass cover plate to p-polarized light waves (hereinafter also referred to as "converted p-polarized light waves") and pass the p-polarized light waves and the converted p-polarized light waves through the glass cover plate to increase the light transmission through the cover plate. A drawback of the presently available technology, e.g. as disclosed in the above-mentioned patents, is that the light source is stationary and the light waves travel along a set, unchanging path, such that the light waves are always incident on the surface of the glass substrate at the Brewster-angle, and the s-polarized light waves are converted to p-polarized light waves. In the case of solar cells, the light source is the sun, and the sun travels along a path such that the sun's rays are not always incident on the glass cover plate at the Brewster-angle. Tracking equipment is available to move the solar cell to have the glass cover plate track the movement of the sun such that the sun's rays are incident on the cover plate at the Brewster-angle. However, as is appreciated by those skilled in the art, tracking equipment is expensive and must be maintained in proper operating condition.

Another limitation associated with transmitting light waves through a glass cover plate is the loss of light waves that are re-reflected through the glass cover plate. More particularly, the light waves are incident on a first surface of the glass cover plate, and a portion of the light waves incident on the first surface passes through the first surface into the body of the glass cover plate and a portion of the light is reflected toward an opposite second surface of the glass cover plate. At the opposite second surface of the glass cover plate, a portion of the light waves passes through the second surface, and a portion of the light waves is reflected back toward and through the first surface of the glass cover plate.

As can now be appreciated, it would be advantageous to provide a transparent plate or substrate, for example, but not limited to a display cover and/or a cover plate for a solar absorbing device, for example, but not limited to a solar cell, that minimizes, if not eliminates, the limitations of the presently available cover plates by increasing solar light transmission through the transparent plate, for example, but not limited to a display cover and/or a cover plate of a solar cell.

BRIEF DESCRIPTION OF THE DRAWINGS

FIG. 5 is an isometric view of a Brewster tetrahedron of the invention.

FIG. 6 is a view similar to the view of FIG. 5 showing the Brewster tetrahedron of the invention rotated one surface or facet in a counter clockwise direction.

FIG. 7 is an isometric view of a transparent substrate having a Brewster tetrahedron cavity of the invention in a surface of the transparent substrate.

FIG. 10 is an isometric view of a transparent substrate having an inverted Brewster tetrahedron of the invention on the surface of the transparent substrate.

SUMMARY OF THE INVENTION

Figure 1A:
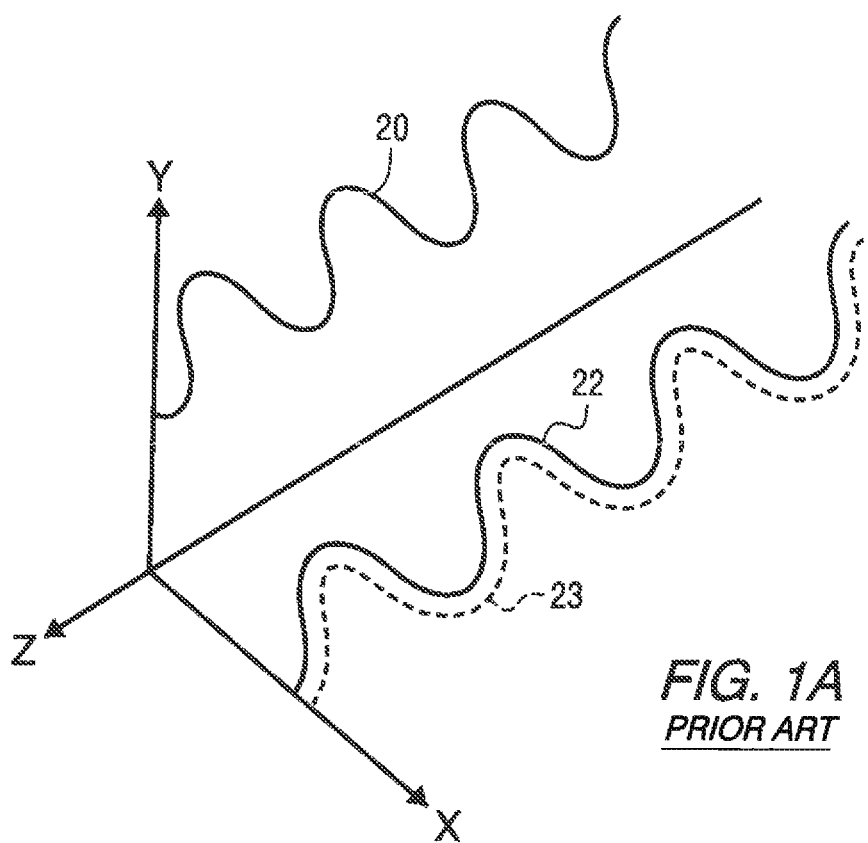
FIG. 1A is a sketch showing p-polarized light waves and s-polarized light waves in their respective plane as understood in the prior art.

This invention relates to a transparence for converting s-polarized light waves to converted p-polarized light waves. In one non-limiting embodiment of the invention the transparency includes, but is not limited to a transparent substrate having a first major surface and an opposite second major surface; a tetrahedron including, but not limited to, points A, B, C and D, wherein a first triangular facet is defined by sides extending between points A-B-D and the sides of the first facet at the point A subtend a first angle and the sides of the first facet at the point B subtend a second angle, wherein the first and second angles are equal to one another; a second triangular facet is defined by sides extending between points A-B-C and the sides of the second facet at the point A subtend a third angle and the sides of the second facet at the point B subtend a fourth angle, wherein the third and fourth angles are equal to one another; a third facet is defined by sides extending between points B-C-D, and a fourth facet is defined by sides extending between points A-C-D, and the sides of the first facet lie in a plane of the first major surface of the transparent substrate and surfaces of each of the second, third and fourth facets have a reflective surface.

Further this invention relates to a transparence for capturing internally reflected light. In one non-limiting embodiment of the invention the transparency includes, but is not limited to, a transparent substrate having a first major surface and an opposite second major surface; a tetrahedron comprising points E, F, G and H, wherein a first triangular facet is defined by sides extending between points E-F-H and the sides of the first facet at the point E subtend a first angle, the sides of the first facet at the point F subtend a second angle, and the sides of the first facet at the point H subtend a third angle wherein the first, second and third angles are equal to one another; a second triangular facet is defined by sides extending between points E-F-G; a third facet is defined by sides extending between points F-G-H, and a fourth facet is defined by sides extending between points E-G-H, and the sides of the first facet lie in a plane of the first major surface of the transparent substrate and surfaces of each of the second, third and fourth facets have a reflective surface.

DESCRIPTION OF THE INVENTION

As used herein, unless otherwise expressly specified, all numbers such as those expressing values, ranges, amounts or percentages are read as if prefaced by the word "about", even if the term does not expressly appear. When referring to any numerical range of values, such ranges are understood to include each and every number and/or fraction between the stated range minimum and maximum. For example, a range of "1 to 10" is intended to include all sub-ranges between (and including) the recited minimum value of 1 and the recited maximum value of 10, that is, having a minimum value equal to or greater than 1 and a maximum value of equal to or less than 10. Also, as used herein, the term "applied over", and "deposited over" means applied, and deposited, on but not necessarily in surface contact with. For example, one surface, article, film or component "applied over", and "deposited over" another surface, article, film or component of an article or apparatus does not preclude the presence of materials between the surfaces of the articles, or between components of the article or apparatus, respectively.

Before discussing non-limiting embodiments of the invention, it is understood that the invention is not limited in its application to the details of the particular non-limiting embodiments shown and discussed herein since the invention is capable of other embodiments. Further, the terminology used herein to discuss the invention is for the purpose of description and is not of limitation. Still further, unless indicated otherwise, in the following discussion like numbers refer to like elements.

In the following discussion, the non-limiting embodiments of the invention are directed to transparent cover plates for solar absorbing devices, e.g. but not limited to solar cells. The invention, however, is not limited thereto and can be practiced with any type of substrate through which light waves can passed, e.g. but not limited to, a transparent office wall divider, e.g. a glass office wall divider; a door having a transparent panel, e.g. a glass window; an automobile roof window; glass panels for a hot house; glass cover plates for outdoor lighting, and display cover glasses. Further, the following discussion of the non-limiting embodiments of the invention for purposes of clarity are categorized as Category (A) directed to increasing the probability of solar energy being incident on surfaces of a transparency at a Brewster angle and changing s-polarized light waves to p-polarized light waves, and Category (B) directed to preventing light waves from being re-reflected back through a surface of transparent substrate.

Further, in the following discussion the cover plates are made of glass. The invention, however, is not limited thereto and can be made of any material, e.g., plastic, that can pass light waves.

Non-Limiting Embodiments of Invention of Category (A)

The discussion is now directed to non-limiting embodiments of transparent cover plates of the invention that have a shaped surface to increase the probability of light waves, e.g. but not limited to solar energy, being incident on surfaces of the cover plate at a Brewster angle and changing s-polarized light waves to converted p-polarized light waves to increase percent of light wave transmission through the cover plates.

As is appreciated by those skilled in the art, solar energy provides visible collimated light waves, which light waves become polarized when the light waves impinge on a surface at a Brewster angle. The p-polarized light waves are passed or refracted through the surface, and the s-polarized light waves are reflected from the surface. More particularly and with reference to FIG. 1A, there is shown a light wave 20 in the YZ plane, and a light wave 22 in the XZ plane. For purposes of discussion and not limiting to the invention, the XY plane is the plane of incidence, which is the plane on which solar energy or light waves from a light source is incident or impinges. The p-polarized wave 22 is parallel to the XZ plane, and the s-polarized wave 20 is perpendicular to the XZ plane. A "converted p-polarized light wave" as the term is used herein to discuss the invention is the s-polarized light wave 20 rotated 90° such that the s-polarized wave 20 is a converted p-polarized wave 23 (shown in phantom in FIG. 1) and is parallel to the XZ plane and now acts as a p-polarized light wave Shown in FIG. 1B is a graph having curves showing the reflectance for s-polarized light (Rs) and for p-polarized light (Rp) for angles of incidence in the range of 0° to 90° for a Brewster angle of about 60°.

Figure 1B:
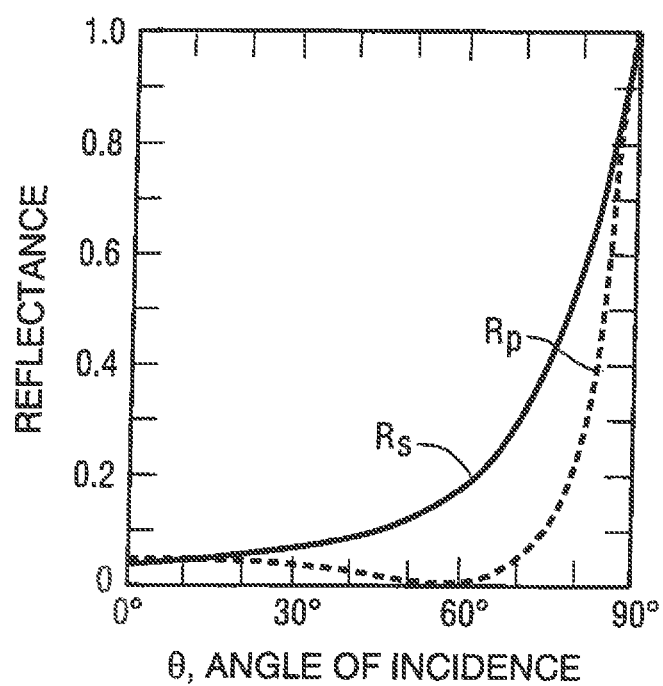
FIG. 1B is a graph showing typical percent reflection at various angles of incidence for p-polarized light waves and s-polarized light waves in their respective plane at a Brewster angle of 60° as understood in the prior art.
Figure 2:
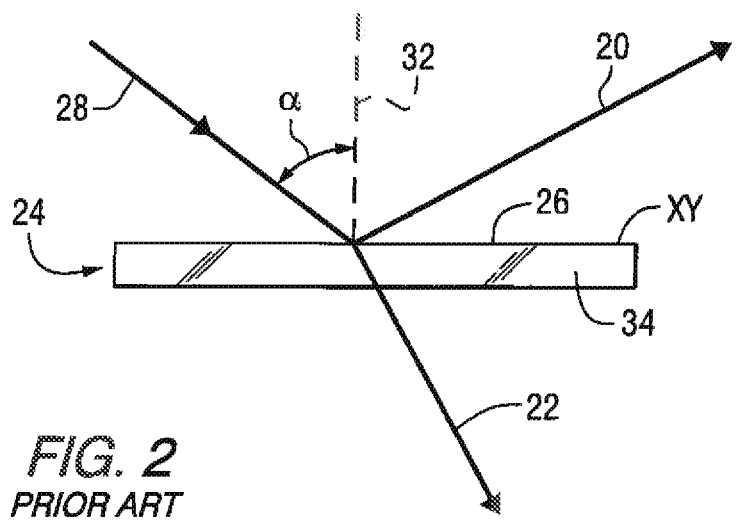
FIG. 2 is a side view of light incident on a glass surface at a Brewster angle "alpha" and the transmitted p-polarized light waves and the reflected s-polarized light waves as understood in the prior art.
Figure 3:
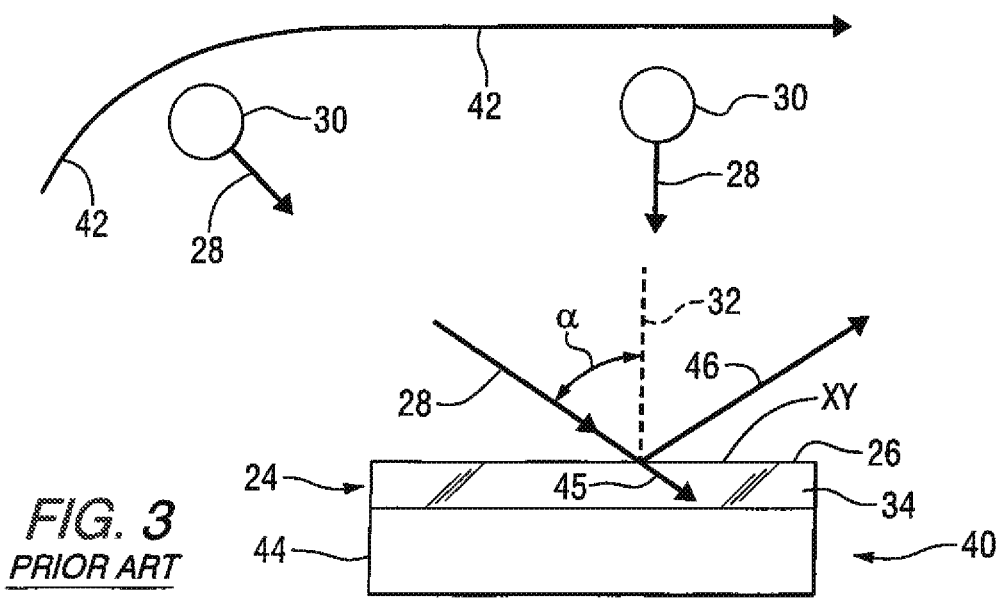
FIG. 3 is a sketch showing the sun moving along its path over a solar cell as understood in the prior art.

With reference to FIGS. 2 and 3 as needed there is shown a transparent dielectric substrate, e.g. but not limiting to the invention, a glass substrate 24 having a surface 26 lying in the plane of incidence XY. Culminated light beams from a light source, e.g. but not limited to sun 30 (shown in FIG. 3) is shown as a single ray 28 instead of multiple rays for purposes of clarity. The ray 28 impinges on the surface 26 of the glass substrate 24, i.e. the plane XY at an angle of incidence "α" or "alpha". As shown in FIG. 2, the angle "alpha" is the angle subtended by the ray 28 and an imaginary line 32 normal to the substrate surface 26. When the angle "alpha" is at a Brewster-angle or a polarization angle, the collimated light ray 28 is polarized at the substrate surface 26, and 100% of the p-polarized light waves 22 are refracted through the surface 26 into body 34 of the substrate 24, i.e. there is no reflection of the p-polarized light waves 22 at the Brewster angle (see FIG. 1B), and a substantial part (typically 15-20%) of the s-polarized light waves 20 are reflected from the substrate surface 26, i.e. the transmission of the s-polarized light wave 20 through the surface 26 into the body 34 of the substrate 24 is significantly reduced.

As is appreciated by those skilled in the art, the Fresnel equations predict that the light waves 22 with the p-polarization will not be reflected if the angle of incidence (shown as the angle "alpha" in FIG. 2) is given by the following Equation:

$$\text{alpha} = \arctan(n_2/n_1), \text{ where } n_1 \text{ and } n_2 \text{ are the refractive indices of the two mediums.} \quad \text{Equation}$$

The Equation is known as Brewster's law, and the angle alpha defined by the Equation is the Brewster-angle. Although not limiting to the invention, and unless indicated otherwise, the substrate 24 in the discussion of the non-limiting embodiments of the invention is glass used in an air environment. In general, glass has a refractive index ($n_2$) of 1.51, and air ($n_1$) has a refractive index of 1.00, and the Brewster-angle, or the angle alpha is approximately 56°. Although the reflectance for p polarized light is 0 for this specific angle only, it is generally accepted that the reflectance for p polarized light remains very low in a range of about +/−15° of the Brewster angle. By way of illustration and not limiting to the invention, the range for the Brewster angle of FIG. 1B is 45° to 75°. In the practice of the invention, the useable Brewster angle range is "minus 50% of the Brewster angle to plus 35% of the Brewster angle"; more preferably the range is "minus 25% of the Brewster angle to plus 25% of the Brewster angle" and most preferably "minus 20% of the Brewster angle to plus 5% of the Brewster angle". For purposes of clarity, when the Brewster angle is 60°, the useable Brewster angle range is "minus 50% of 60° to plus 35% of 60°, or 30°-81°; more preferably the range is "minus 25% of 60° to plus 25% of 60°" or 45° to 75° and most preferably "minus 20% of 60° to plus 5% of 60°, or 48° to 63°.

With continued reference to FIGS. 1A and 2 as needed, in this non-limiting embodiment of the invention, the s-polarized light waves 20 are rotated 90° toward the substrate surface 26 or the plane XY to convert the reflected s-polarized light waves 20 to the converted p-polarized light waves 23 to act as p-polarized light waves 21. The converted p-polarized light waves 23 (see FIG. 1) are directed toward the substrate surface 26 or plane XY at the Brewster-angle to refract 100% of the converted p-polarized light waves 23 into the substrate 24, i.e. there is no reflection of the converted p-polarized light waves 23 from the substrate surface 26.

With reference to FIG. 3, a solar cell 40 is mounted in a stationary position relative to the sun 30 moving in its orbit designated by the line numbered 42. In general and not limiting to the invention, the solar cell 40 includes the glass cover plate, e.g. the glass substrate 24 mounted over a photovoltaic module 44. As the sun 30 moves in its orbit 42, the angle of incidence, i.e. the angle "alpha" moves through the range of −90° to 90°. With the arrangement shown in FIG. 3, a part 46 of the incident rays 28 (only one ray shown instead of a plurality of rays for purposes of clarity) is reflected by the air-glass interface or surface 26 of the glass substrate 24, and another part 45 of the incident rays 28 is refracted through the air-glass interface 26 toward the solar cell 44. The percentage of the reflected ray 46 with respect of the transmitted ray 45 increases at increasing incident angles (increasing the angle alpha), having a minimum of about 4% at orthogonal incidence and a maximum of 100% at 90°.

Figure 4:
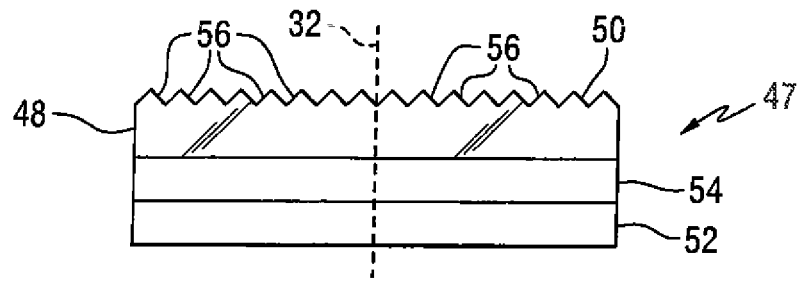
FIG. 4 is a side view of a solar cell having a cover plate incorporating features of the invention.

With reference to FIG. 4, there is shown a solar cell 47 incorporating features of the invention. The solar cell 47 includes a transparent substrate or glass cover plate 48 having a patterned outer surface 50 of the invention facing the sun 30 (see FIG. 3). The cover plate 48 of the solar cell 47 is securely mounted to a photovoltaic module 52, e.g. but not limiting to the invention, to a mono-crystalline silicon module 52 by an ethyl vinyl acetate (EVA) interlayer 54. As the rays 28 of the sun 30 move over the patterned surface 50 of the cover plate 48, the rays 28 are incident on facets 56 of the pattern surface 50 at an angle within the Brewster-angle range (discussed above) more than once. More particularly, once in the angle of incidence in range of 0° to 90° and once in the angle of incidence in range of greater than 90° to 180°. Further, there is a high probability that the s-polarized rays reflected from one facet onto a facing adjacent facet will change the s-polarized light waves 20 to convert the s-polarized light waves 20 to converted p-polarized light waves 23 (see FIG. 1). The converted p-polarized light waves 23 impinge on the facing adjacent facet at an angle within the Brewster angle range to pass the converted p-polarized light wave 21 through the facing adjacent facet, or the converted p-polarized light waves 23 impinge on the facing adjacent face at an angle other than an angle within the Brewster angle range and is reflected from the facing adjacent facet to other facets of the cover plate with an increased probability that the reflected converted p-polarized light waves 23 impinge on other facets of the cover plate 48 at an angle within the Brewster-angle range, or other incident angle near to the orthogonal incident angles (normal incidence) when reflection is minimal, e.g. but not limiting to the discussion, close to 4%. Part of the light will be back-reflected towards the source, e.g. the sun 30, which is considered as loss. This feature of the invention is discussed in more detail below.

In this non-limiting embodiment of the invention, the probability of the rays 28 from the sun 30 and the light waves reflected from the facets 56 of the patterned surface 50 of the cover plate 48 is increased by the patterned surface 50 having facets 56 representative of a surface of a Brewster tetrahedron 59 (see FIGS. 5 and 6) of the invention. With reference to FIGS. 5 and 6 as needed, the Brewster tetrahedron 59 includes a base 60 defined by lines between points A-B-D, a first surface 62 defined by lines or sides between points A-B-C, a second surface 64 defined by lines or sides between points B-C-D (shown only in FIG. 5), and a third surface 66 defined by lines or sides between points A-C-D (shown only in FIG. 6). In the following discussion the base 60 and the sides 62, 64 and 66 are defined by X, Y, Z co-ordinances (see FIG. 1) with the first value on the X axis, the second value on the Y axis and the third value on the Z axis. In one non-limited embodiment of the invention, the co-ordinance for point A is (0, 0, 0), for point B is (1, 0, 0), for point C is (0.5, 0.8125, 0), and for point D is (0.5, 0.5, 0.75). The triangle A-B-D is an isosceles triangle with the angle subtended by the sides 68 and 70 at the point A (also referred to as "Angie 80"), and the angle subtended by the sides 68 and 74 at the point B (also referred to as "Angle 81") equal to one another; the triangle A-B-C is an isosceles triangle with the angle subtended by the sides 68 and 72 at the point A (also referred to as "Angle 87"), and the angle subtended by the sides 68 and 76 at the point B (also referred to as "Angle 88") equal to one another. The triangles A-D-C and C-B-D are irregular triangles, i.e. the angles of the triangle A-D-C are unequal to one another and the angles of the triangle C-B-D are unequal to one another. The size of the Brewster tetrahedron is not fixed, and the side 68 between points A-B; the side 70 between points A-D; the side 72 between points A-C; the side 74 between points B-D; the side 76 between points B-C, and the side 78 between points C-D are not fixed and can be scaled arbitrarily.

With reference to FIG. 7 there is shown a transparent substrate 98, e.g. but not limited to the discussion, a glass cover plate 98 having a first major surface 100 and an opposite second major surface 102, with the first major surface 100 lying in a plane e.g. the XY plane (see FIG. 1). In this non-limiting embodiment of the invention, the glass substrate 98 has a cavity 104 formed in the surface 100. The cavity 104 is sized and shaped to have the outer dimensions of the Brewster tetrahedron 59. More particularly, the Brewster tetrahedron 59 can be placed in the cavity 104 with the outline of the surface of the base 60 of the Brewster tetrahedron 59 lying in a plane containing the surface 100 of the substrate 98 with the point c of the Brewster tetrahedron cavity 104 between the surfaces 100 and 102 of the glass substrate 98. In this non-limiting embodiment of the invention, the surface 100 of the substrate 98 lies in the XY plane or the plane of incidence XY. For purposes of clarity, the base 80 and the surfaces 62, 64, and 66 of the Brewster tetrahedron 59 defined by the sides or lines between the points A-B-D; A-B-C; C-B-D, and D-A-C (see FIGS. 5 and 6), are outlines of the surfaces of the Brewster tetrahedron cavity 104 defined by the sides or lines between the points a-b-d; a-b-c; c-b-d, and d-a-c, respectively (see FIG. 7).

Figure 8:
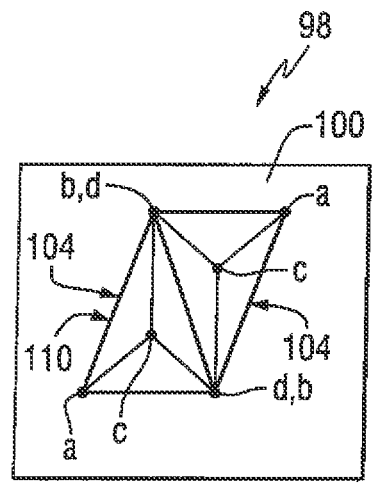
FIG. 8 is a plan view of a transparent substrate having a union of two Brewster tetrahedron cavities of the invention (hereinafter also referred to as a "unit cell" or "unit cell of two Brewster tetrahedron cavities").
Figure 9:
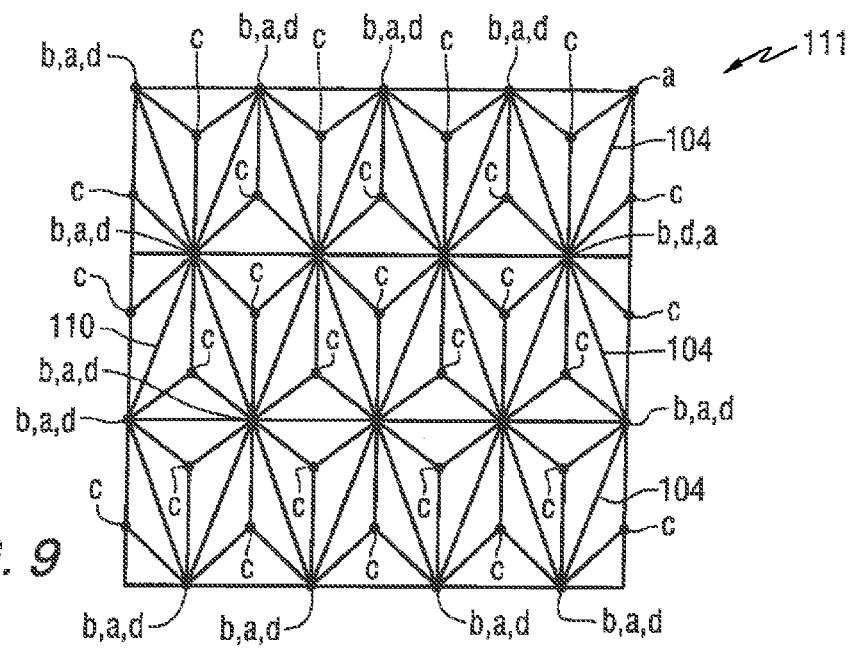
FIG. 9 is a plan view of a transparent substrate having a plurality of unit cells of two Brewster tetrahedron cavities of the invention.

With reference to FIG. 8, there is shown a cavity 110 in the surface 100 of the glass substrate 98 of a union of two Brewster tetrahedron cavities (hereinafter also referred to as a "unit cell" or "unit cell of two Brewster tetrahedron cavities") of the invention that includes two Brewster tetrahedron cavities 104 with the side between the points a-b of the two adjacent Brewster tetrahedron cavities 104 overlaying one another. Further as shown in FIG. 8 the points b and d of adjacent Brewster tetrahedron cavities over lay one another and form one point identified as d,b or b,d. Shown in FIG. 9 is a transparent or glass substrate 111, e.g. but not limiting to the invention, a glass cover plate 111 to cover a solar cell 44 (see FIG. 3) having a plurality of the unit cell of two Brewster tetrahedron cavities 110 arranged in surface 112 of the substrate 111 in accordance to a non-limiting embodiment of the invention. More particularly, the points a-b-d of the unit cell of the Brewster tetrahedron cavity 110 which corresponds to the points A-B-D of the Brewster tetrahedron 59 (see FIGS. 5 and 6) lie in a plane, e.g. the XY plane (see FIG. 1) with the side 74 between the points d-b of the two adjacent Brewster tetrahedron cavities 104 overlaying one another, and the side 70 between the points a-d of adjacent unit cells of two Brewster tetrahedron cavities 124 overlaying one another as shown in FIG. 9. Further as shown in FIG. 9 the points a, b and d of adjacent Brewster tetrahedron cavities over lay one another and form one point identified as a,d,b or variations thereof. In general the d points of adjacent ones of the unit cells of two Brewster tetrahedron cavities 110 are adjacent to one another, and the light waves or rays 28 from the sun 30 (see FIG. 3) are incident on the surfaces of the cavities 110 corresponding to the surfaces of the sides 62, 64 and 66 of Brewster tetrahedron 59. With reference to FIG. 8, the point c of the unit cells of two Brewster tetrahedron cavities 110 are within the body of the substrate 98 between the surfaces 100 and 102

Consider now the solar rays 28 incident on the surface defined by the sides between the points a-b-c, a-c-d and b-c-d of the unit cells of two Brewster tetrahedron cavities 110. The rays 30 are incident on the surfaces or facets defined by the lines or sides between the points a-b-d, a-c-d and b-c-d of the unit cell of two Brewster tetrahedron cavities 110 at changing angles of incidence as the sun 30 moves along its path 42 (see FIG. 3), and provides groups of rays 28. If light rays are coming at normal incidence (parallel to the cell surface's normal vector), the rays that impinge facet a-b-c are incident at facet a-b-c at the Brewster angle. One part of the s-polarized component and 100% of the p-polarized component is refracted by the a-b-c surface. The other part of s-polarized component is reflected by the a-b-c surface and reaches the d-b-c or the d-a-c facet as "converted p-polarized light ray". 100% of "converted p-polarized light ray" is refracted by the d-b-c or d-a-c facets, and there is no reflection at all.

If the light rays are coming at normal incidence (parallel to the unit cell surface's normal vector), the rays that impinge facet a-c-d and facet b-c-d has large incident angles, most of the light is reflected toward facet a-b-c where the incident angle becomes close to the normal, and therefore the probability of the refraction is maximized, in other words the reflection is minimized.

If the light rays are not coming at normal incidence (parallel to the unit cell surface's normal vector), the probability of the refraction is still increased as the reflectance for p polarized light is 0% for this specific angle only, it remains very low in the Brewster angle range discussed above, thus the invention is applicable in a wide range of incidence angles within the Brewster angle range. Additionally the refraction is further increased by the "imprisonment" of the light (multiple reflection and simultaneous refraction at each reflection) inside the cavity. The "imprisonment" of the light is discussed in more detail below.

Figure 11:
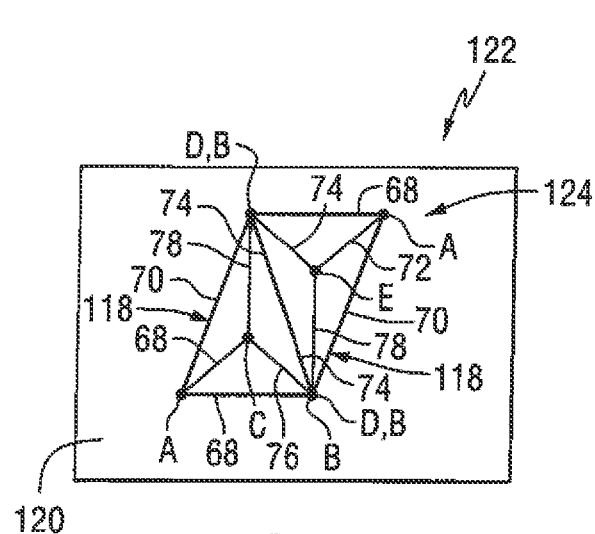
FIG. 11 is a plan view of a transparent substrate having a union of two inverted Brewster tetrahedrons of the invention (hereinafter also referred to as a "unit cell" or "unit cell of two inverted Brewster tetrahedrons").
Figure 12:
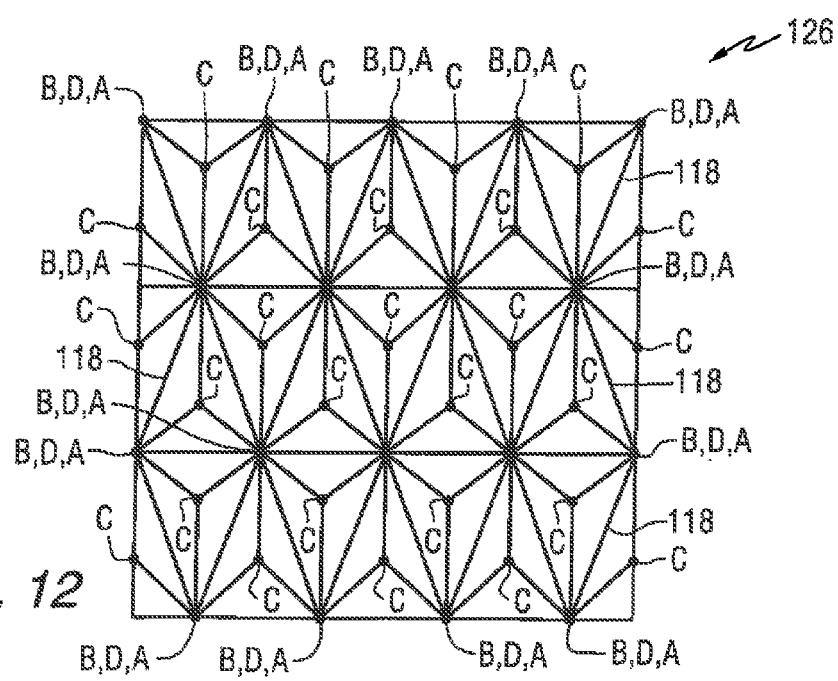
FIG. 12 is a plane view of a transparent substrate having a plurality of unit cells of two inverted Brewster tetrahedrons of the invention.

With reference to FIGS. 10-12 as needed, there is shown another non-limiting embodiment of the invention. The Brewster tetrahedron 59 (see FIGS. 5 and 6) used in this non-limiting embodiment of the invention for purposes of clarity is referred to as "inverse Brewster tetrahedron" and is designated by the number 118 (see FIG. 10). In this embodiment of the invention, the surface 60 defined by the sides 68, 70 and 74 and the points A-B-D of the Brewster tetrahedron 59 (see FIGS. 5 and 6) is in the plane XY (see FIG. 1) containing the surface 120 of the glass substrate 122 with the point C spaced from the surface 122 a smaller distance than the spaced distance from the surface 124 of the substrate 122 (see FIG. 10). Shown in FIG. 11 is an inverse Brewster tetrahedron unit cell 124, which includes two inverse Brewster tetrahedrons 118 with the side 74 between points B-D of each of the inverse Brewster tetrahedron overlapping one another and opposite to one another. Further as shown in FIG. 11 the points B and of adjacent Brewster tetrahedrons over lay one another and form one point identified as D,B or B,D.

Shown in FIG. 12 is a transparent substrate 126, e.g. but not limited to, a glass cover plate 126 to cover a solar cell, e.g. the solar cell 44 (see FIG. 3), having a plurality of the inverse Brewster tetrahedron cells 124 arranged in accordance to a non-limiting embodiment of the invention. More particularly, the facet 60 defined the points A-B-D of the inverse Brewster tetrahedron cell 124 is a portion of the surface 120 of the glass substrate 122 and lies in the XY plane (see FIG. 1). Adjacent sides 60 of the inverse Brewster tetrahedrons overlap one another. In general the C points of adjacent inverse Brewster tetrahedron cells 124 are adjacent to one another, and the wave beams or rays 28 from the sun 30 (see FIG. 3) are incident on the facets 64, 62 and 66 defined by the points B-C-D; A-B-C and A-D-C, respectively, of the inverse Brewster tetrahedron unit cell 124 (see FIG. 11).

With continued reference to FIG. 12 there is shown a transparent or glass substrate 126, e.g. a glass cover plate 126 having an array of joined unit cells of inverse Brewster tetrahedrons 124. The cover plate 126 is similar to the cover plate 111 (FIG. 9) except that the Brewster tetrahedrons of the cover plate 111 are formed by walls of a cavity within the body of the cover plate 111 in a similar fashion as the cavity 104 shown in FIG. 7 is between the surfaces 100 and 102 of the substrate 98, whereas the inverse Brewster tetrahedrons of the cover plate 126 is outside of the body of the cover plate 126 in a similar fashion as shown for the inverse Brewster tetrahedron of the substrate 122 of FIG. 3. Further as shown in FIG. 12 the points B, D and A of adjacent Brewster tetrahedrons over lay one another and form one point identified as A, C, B or variations thereof.

The non-limiting embodiment of the invention discussed above identified the surface 60 between the Points A-B-D of the Brewster tetrahedron 59 (FIGS. 5 and 6) as the base and provided for the base 60 to be in the plane of incidence XY (FIG. 1). The invention, however, is not limited thereto and the surface 62 between the points A-B-C can be used as the base. The exchange can be made because both triangles A-B-C and A-B-C are isosceles triangles. As can be appreciated, and with reference to FIGS. 9 and 12 using the surface of one of the isosceles triangles as a base provide a surface of a cover plate that is almost 100% angled facets or angled surfaces relative to the light source, e.g. but not limited to the sun, which is expected to maintain the light rays 28 (see FIG. 3) reflected from one angled surface to another until the s-polarized light rays are converted to p-polarized light rays.

Further, with the arrangement discussed above, the light rays coming at normal or arbitrary incidence do not impinge the facets at the Brewster angle. The probability of the refraction is increased by the "imprisonment" of the light (multiple reflection and simultaneous refraction at each reflection) between adjacent facing surfaces of the inverse Brewster tetrahedron cells 124. The light absorption in the unit cell 124 is also increased by the light-trapping phenomenon. The physics associated with this arrangement is similar to the physics associated with category B discussed below.

Non-Limiting Embodiments of Invention of Category (B)

The discussion is now directed to non-limiting embodiments of category (B) of the invention directed to increasing light trapping. The term "light trapping" as used herein means the use of surface structures to optimize the penetration of light into a substrate or an absorber, e.g. but not limited to a cover plate, or a photovoltaic module, of a solar cell solar, while reducing the transmission of the reflected light beams out of the substrate or absorber.

Figure 13:
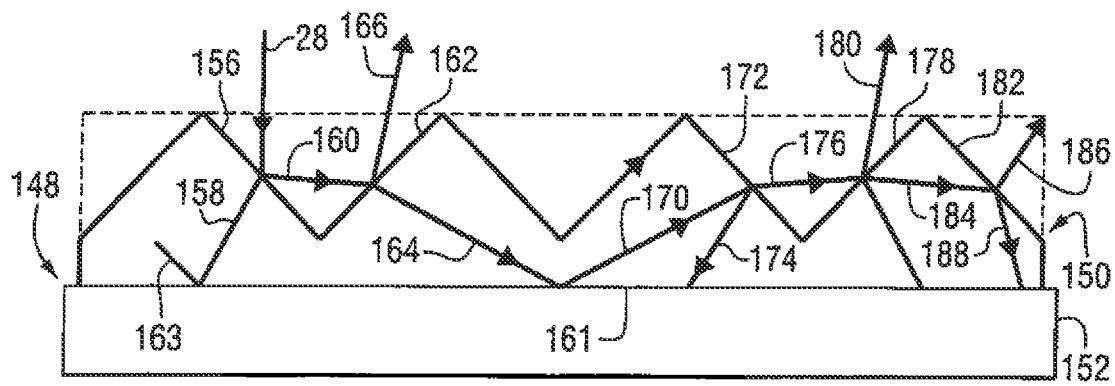
FIG. 13 is a sketch showing the path of internal reflected light rays to increase light trapping in accordance to the teachings of the invention.

With reference to FIG. 13, there is shown a cross section of a solar cell 148 having a transparent substrate 150, e.g. but not limited to a glass cover plate 150 positioned over a light beam absorber 152, e.g. but not limited to a photovoltaic module 152. The ray 28 of the sun 30 is incident on a shaped surface facet 156 of the cover plate 150. A portion of the ray 28 passes through the facet 156 into the cover plate 150 as ray 158 and another portion of the ray 28 is reflected from the surface facet 156 as ray 160 to a surface facet 162 of the cover plate 150. The ray 158 is incident on surface 161 of the cover plate 150, which is opposite to the surface of the cover plate having the facet 156, and a portion of the ray 158 is reflected away from the surface 161 of the cover plate as ray 163.

A portion of the ray 160 passes through the facet 162 as ray 164 into the cover plate 150 and the remaining portion of the ray 160 is reflected away from the cover plate 150 as ray 166. The ray 164 passes through the cover plate 150 and is incident on the surface 161 of the cover plate 150. A portion of the ray 164 is reflected as ray 170 to surface facet 172. The ray 170 is incident on the surface facet 172 and a portion of the ray 170 is reflected as ray 174 and is incident on the surface 161 of the cover plate 150, and a portion of the ray 170 passes through the surface facet 172 as ray 176. The ray 176 is incident on the surface facet 178 and reflects a portion of the ray 176 as ray 180 away from the cover plate 150 and reflects the remaining portion of the ray 176 through the surface facet 178 toward the surface facet 182 as ray 184. A portion of the ray 184 passes through the surface facet 182 as ray 186 and the remaining portion of the ray 184 is reflected from the facet 182 as ray 188, and the ray 188 is incident on the surface 161 of the substrate 150.

From the above discussion, it can be appreciated that the reflection of the rays 158, 164 174 and 188 toward the surface 161 of the cover plate 150 and the absorber 152 increases the total internal reflection of the ray 28. Further as can now be appreciated, increasing the reflection of the rays toward the absorber 152 increases the total internal reflection, reduces the total outer reflection and increases the transmission of the solar energy, e.g. but not limited to visible light passing through the cover plate.

With continued reference to FIG. 13, as is appreciated by those skilled in the art, a portion of the rays 158, 184, 174 and 188 incident on the surface 161 of the cover plate 150 passes through the surface 161 (not shown in FIG. 13 for purposes of clarity) and the remaining portions of the rays 158, 164, 174 and 188 are reflected from the surface 161 (only reflected rays 163 and 170 are shown for purposes of clarity). Further, as can be appreciated by those skilled in the art, a light ray, e.g. a ray of solar energy incident on a surface of a transparent substrate, e.g. the cover plate 150 has a portion of the ray reflected from the surface and a portion of the ray passing through the surface. In FIG. 13 all of the possible combinations of reflected portions and transmitted portions of the rays are not shown for purposes of clarity.

Figure 14:
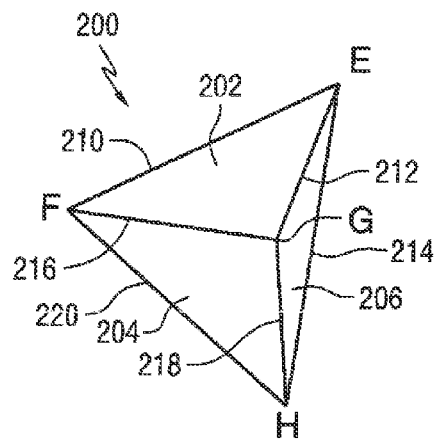
FIG. 14 is an isometric view of a pyramidal tetrahedron of the invention.
Figure 15:
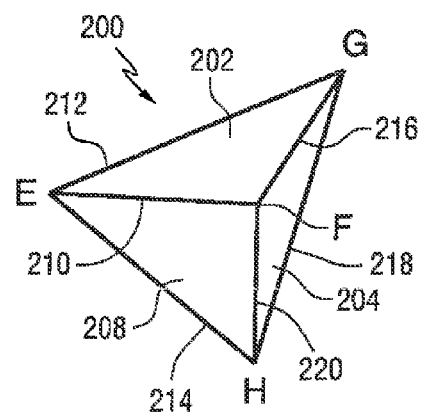
FIG. 15 is a view similar to the view of FIG. 14 showing the pyramidal tetrahedron of the invention rotated one surface or facet in a counter clockwise direction.

With reference to FIGS. 14 and 15 as needed, in the practice of this non-limited embodiment of the invention, a tetrahedron pyramid 200 is used for light trapping. The tetrahedron pyramid includes a base 202 defined by straight lines 210, 212, 216 between points E-F-G, a first surface 204 defined by straight lines 218, 216, 220 between points F-G-H, a second surface 206 defined by straight lines 212, 218, 214 between points E-G-H (shown only in FIG. 14), and a third surface 208 defined by straight lines 210, 214, 220 between points E-F-H (shown only in FIG. 15). The X, Y, Z coordinates for point E is (0, 0, 0), for point F is (1, 0, 0), for point G is (0.5, $\sqrt{3}/2$, 0), and for point H is (0.5, $\sqrt{3}/6$, 0.42). In the preferred practice of the invention, the value 0.42 for the point H was computer calculated to find an optimum value.

In this non-limiting embodiment of the invention, the triangle E-F-G is an equilateral triangle, and the triangles E-G-H; G-F-H and E-F-H are isosceles triangles. As for the triangle E-G-H the angle at point E formed by the sides 212 and 214 is equal to the angle at the point G formed by the sides 212 and 218; as for the triangle G-F-H, the angle at the point G formed by the sides 216 and 218 is equal to the angle at the point F formed by the sides 216 and 220, and as for the triangle E-F-H, the angle at the point F formed by the sides 210 and 220 is equal to the angle E formed by the sides 208 and 210. In the preferred non-limiting embodiment of the invention, the angle at point E formed by the sides 212 and 214; the angle at the point G formed by the sides 212 and 218; the angle at the point G formed by the sides 216 and 218; the angle at the point F formed by the sides 216 and 220; the angle at the point F formed by the sides 210 and 220, and the angle E formed by the sides 208 and 210 are equal to one another. As can be appreciated, as the equal angles of an isosceles triangle increase the surface area of the isosceles triangle increases and visa versa. In the preferred practice of the invention, each of the equal angles of the isosceles are in the range of 40-75° and preferably in the range of 60-75°. In the preferred practice of the invention, each of the triangles E-G-H; G-F-H and E-F-H are isosceles triangles and are equal to one another. The invention, however, contemplates the isosceles triangles being slightly, e.g. greater than 0 to 10% different from one another.

Figure 16:
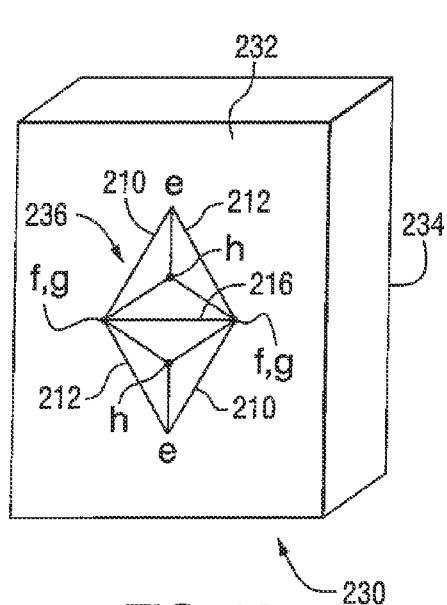
FIG. 16 is an isometric view of a transparent substrate having a union of two pyramidal tetrahedron cavities of the invention (hereinafter also referred to as a "unit cell" or "unit cell of two pyramidal tetrahedron cavities").

With reference to FIG. 16 there is shown a glass substrate 230, e.g. but not limited to the discussion a glass cover plate 230 having a first major surface 232 and an opposite second major surface 234. A cavity 236 is formed in the first major surface 232, and the cavity 236 is sized and shaped to have the outer dimensions of a light trapping cell 236 of the invention. More particularly, two light trapping pyramidal tetrahedrons 200 can be placed in the cavity 236 with a point, e.g. but not limiting to the invention the point H of the two pyramidal tetrahedrons between the surfaces 232 and 234 of the glass substrate 230, and the sides between the points F and G overlapping one another. For purposes of clarity, the surfaces between the points E-F-G; E-G-H; G-F-H and E-F-H designate the points of the light trapping pyramidal tetrahedron 200 (see FIGS. 14 and 15) and points e-f-g; e-g-h; g-f-h, and e-f-h designate points of the light trapping pyramidal tetrahedron cavity 236 corresponding to the points E-F-G; E-G-H; G-F-H and E-F-H of the light trapping pyramidal tetrahedron 200. Further as shown in FIG. 16 the point b and d of adjacent tetrahedron 200 over lay one another and form one point identified as f, g or g, f.

Figure 17:
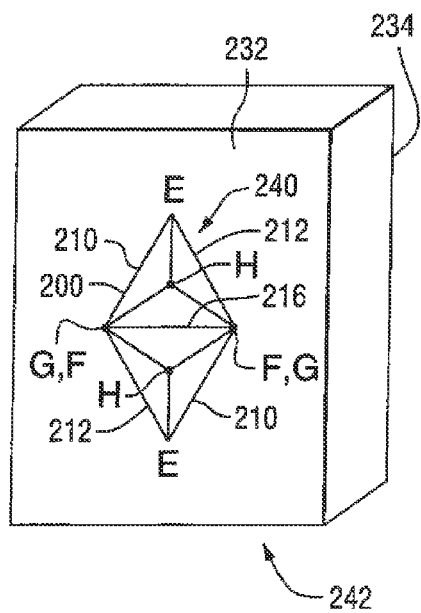
FIG. 17 is an isometric view of a transparent substrate having a shape of a union of two inverted pyramidal tetrahedrons of the invention (hereinafter also referred to as a "unit cell" or "unit cell of two pyramidal tetrahedrons").

With reference to FIG. 17 there is shown another non-limiting embodiment of the invention. In this embodiment of the invention, a pyramidal tetrahedron cell 240 including two pyramidal tetrahedrons 200 is formed on the surface 232 of cover plate 242. The pyramidal tetrahedron cell 240 has the surface within the points E-F-G on, or as part of, the surface 232 of the glass cover plate 242 with the side 216 between the points F-G of the pyramidal tetrahedrons 200 overlaying one another. The pyramidal tetrahedron cell 240 of this non-limiting embodiment of the invention for purposes of clarity is referred to as "inverse pyramidal tetrahedron" and is designated by the number 240. Further as shown in FIG. 17 the points F and G of adjacent inverse pyramidal tetrahedron cavities over lay one another and form one point identified as F,G or G,F.

Figure 18:
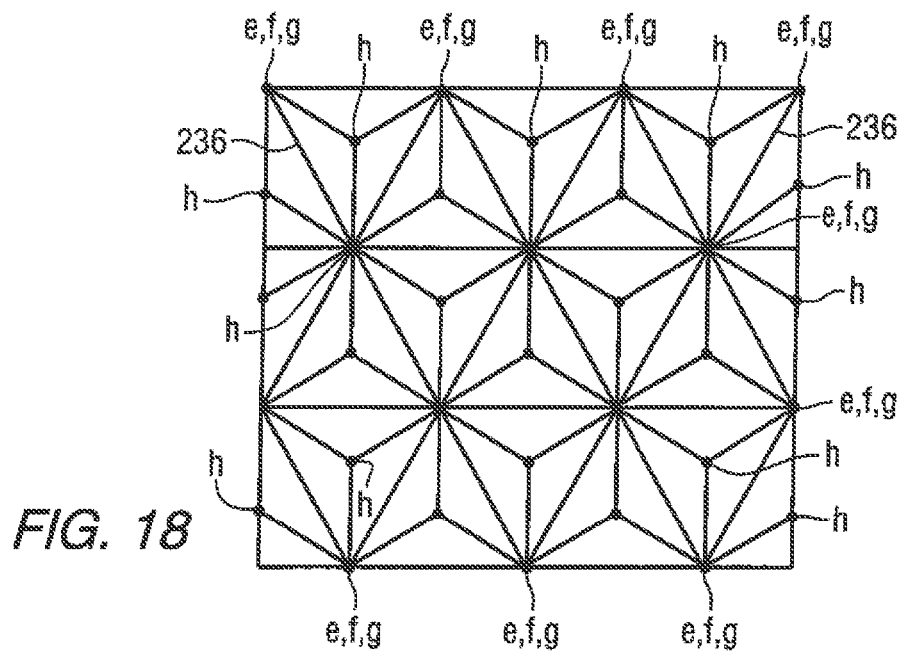
FIG. 18 is a plan view of a transparent substrate of the invention having a plurality of unit cells of two pyramidal tetrahedron cavities of the invention.
Figure 19:
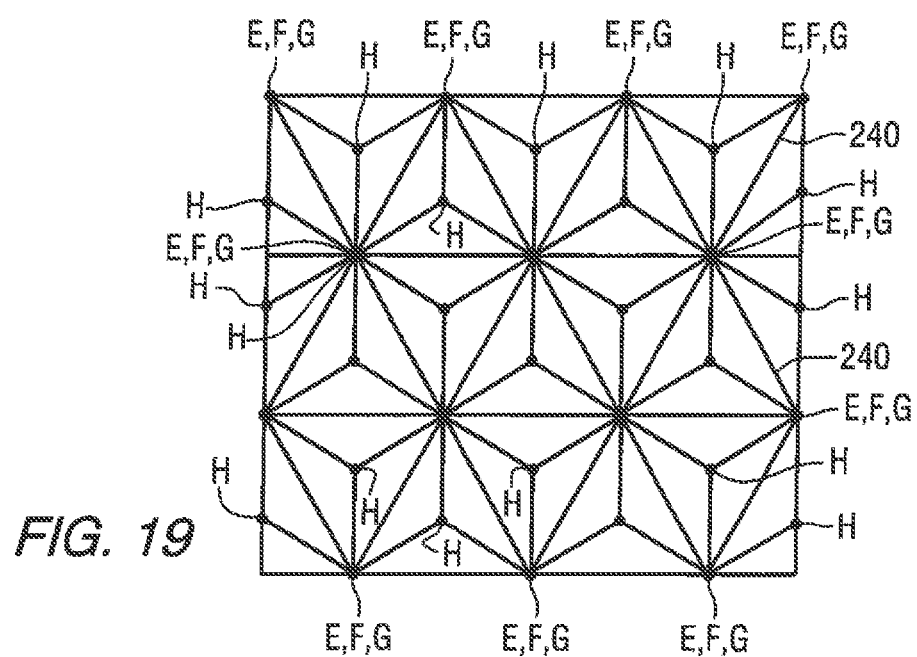
FIG. 19 is a plan view of a transparent substrate of the invention having the shape of a plurality of unit cells of the pyramidal tetrahedron of the invention.

Shown in FIG. 18 is a view of the cover plate 230 having a plurality of pyramidal tetrahedron cell cavities 236, and FIG. 19 is a view of the cover plate 242 having a plurality of inverse pyramidal tetrahedron cells 240. As can be appreciated, because the base 202 of the pyramidal tetrahedron is an equilateral triangle any one of the sides 210, 212, 216 of the base equilateral triangle can be in contact with any one of the sides 210, 212, 216 of the equilateral triangle of an adjacent pyramidal tetrahedron. The light ray 28 of the sun 30 incident on the facets of the pyramidal tetrahedron cavity cells 236, e.g. the surfaces between the points e-f-h; f-g-h and e-g-h of the pyramidal tetrahedron cell cavities 236 follow a similar if not identical reflection pattern discussed above for the cover plate 111 having the Brewster tetrahedron cell cavities 110 (see FIGS. 8 and 9). Further, the discussion above of the internal reflection of the internal light rays 158, 164, 170 174, 184 and 188 reflected from the facets 156, 162, 172 and 178 (see FIG. 13) are applicable for light trapping of internal rays reflected from the surface facets between the points e-f-h, e-g-h and f-h-g of the pyramidal tetrahedron cavity cells 234 shown in FIG. 18. Further as shown in FIG. 18 the points e, f and g of adjacent pyramidal tetrahedrons 200 over lay one another and form one point identified as e,f,g or combinations thereof.

The light ray 28 of the sun 30 incident on the facets of the inverse pyramidal tetrahedron cavity 236, e.g. the surfaces defined by the points e-f-g; f-g-h and e-g-h of the inverse pyramidal tetrahedron cells 236 follow a similar if not exact reflection pattern discussed above for the cover plate 126 having the inverse Brewster tetrahedron cells 126 (see FIGS. 11 and 12). Further, the discussion above of the internal reflection of the internal light rays 158, 164, 170 174, 184 and 188 reflected from the facets 156, 162, 172 and 178 (see FIG. 13) are applicable for light trapping of internal rays reflected from the surface facets between the points E-F-H, E-G-H and F-H-G of the inverse pyramidal tetrahedron cells 240 shown in FIG. 19. Further as shown in FIG. 19 the points E, F and G of adjacent inverse tetrahedrons over lay one another and form one point identified as E,F,G or combinations thereof.

Figure 20:
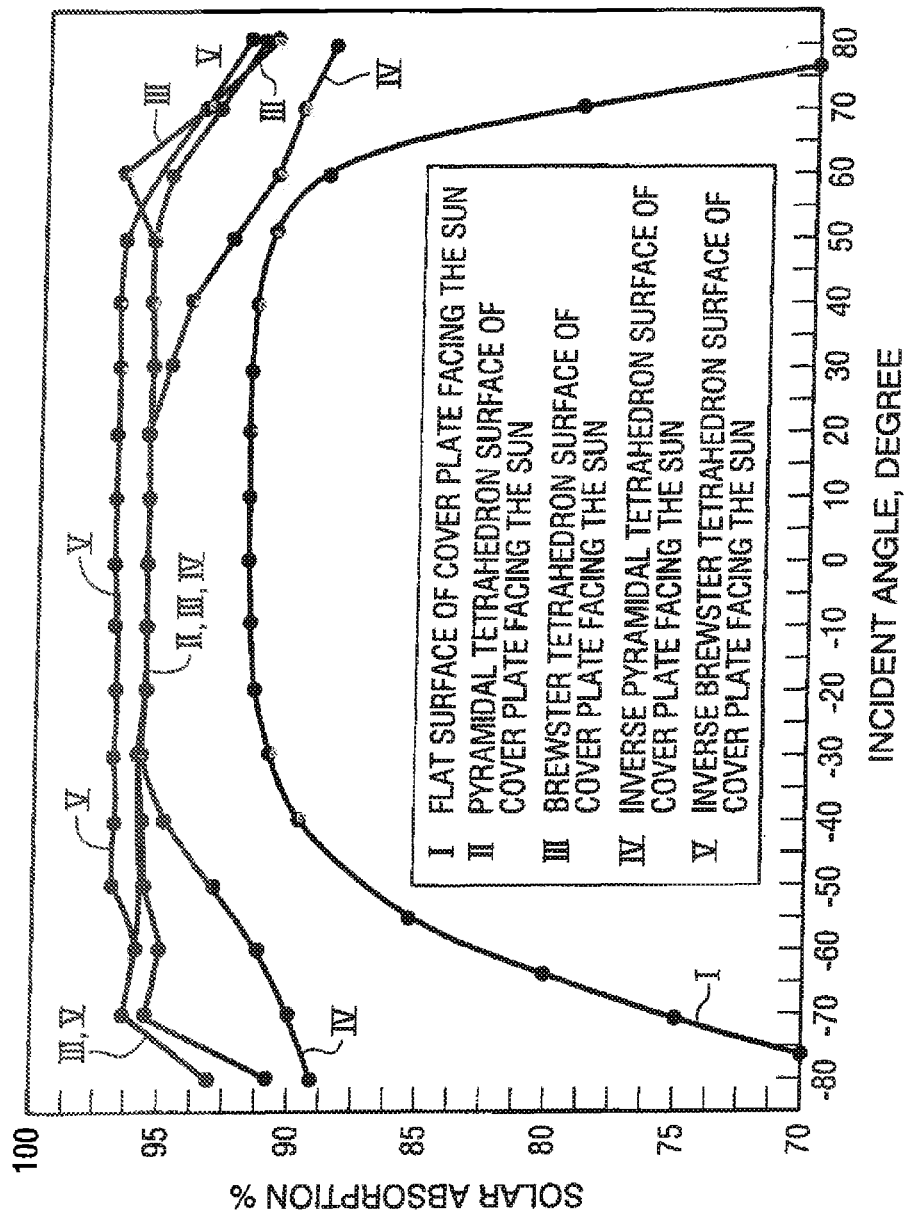
FIG. 20 is a graph having curves drawn using computer generated dated points showing solar absorption for transparent substrates at various angles of incidence, the transparent substrates including transparent substrates incorporating features of the invention.

Five solar cells were modeled using ZEMAX™ computer optical modeling software to calculate the expected solar absorption of a solar cell having different designed cover plates. The solar cells are simulated to rotate around a vertical axis and the surface of the cover plate facing the desired pattern facing the solar source, e.g. the sun. The incident angle of zero degrees is along a line normal to the surface facing the sun, e.g. but not limited to the line 32 in FIG. 3. The incident angle range from −80 to less than zero degrees is to the left of the line 32, and the incident angle range from greater than zero to 80 degrees is to the right of the line 32. The computed results are shown in the graph of FIG. 20. The surface of the cover plates facing the sun were simulated to have (I) a flat surface (see FIG. 3); (II) a pyramidal tetrahedron surface (see FIG. 18); (III) a Brewster tetrahedron surface (see FIG. 9); (IV) an inverse pyramidal tetrahedron surface (see FIG. 19), and (V) an inverse Brewster tetrahedron surface (see FIG. 12). It can be appreciated by those skilled in the art that an increase in solar or light absorption by the cover plate is a reduction in the reflection of the solar or light reflection, and is expected to increase the transmission of solar or light transmission through the cover plate to the solar module 44 (see FIG. 3).

From the curves shown in the graph of FIG. 20, the flat surface cover plate (Curve I) has the lowest absorption in the incident angle range of −80 to 80 degrees and the inverse Brewster tetrahedron surface (Curve V) had the highest absorption. The cover plates II, III and IV generally had the same absorption in the incident angle range of −40° to 30°. The cover plates III and V had higher absorption in the incident angle ranges of −80° to −40° and in the range or 30° to 80°. The cover plate V had the highest absorption in the incident angle of −40° to 30°.

From the above discussion, it can be appreciated that the cover plate having the inverse Brewster tetrahedron surface (cover plate V) had the highest absorption, and the cover plate having the Brewster tetrahedron surface (cover plate III) had the second highest absorption. It is believed that the cover plates III and V were the best performers in the incident angle ranges of −80° to −40° degrees and in the range of 30° to 80° because they have better light trapping than the cover plates I, II, and IV, and they provided more angled facets to convert the s-polarized light to converted p-polarized light.

As can now be appreciated, the invention is not limited to the manner in which the cover plates are made, and any method that can be used to provide the cover plates can be used in the practice of the invention. For example and not limiting to the invention, the cover plates can be made by heating a glass substrate to its softening point and moving an embossed surface having the configuration of a tetrahedron of the invention into the heated glass. Another technique is to cast a plastic substrate or form a glass substrate having a tetrahedron of the invention, and laminating the cast plastic substrate or formed glass substrate to another plastic or glass substrate. Such an arrangement is similar to the laminated arrangement shown in FIG. 4.

It is now readily be appreciated by those skilled in the art that modifications can be made to the non-limiting embodiments of the invention without departing from the concepts disclosed in the foregoing description. It is understood that various changes can be made without departing from the spirit of the invention which is represented by, but not limited to, the following claimed subject matter.

What is claimed is:

1. A transparency for converting s-polarized light waves to converted p-polarized light waves, wherein the transparency comprises:
    a transparent substrate having a first major surface and an opposite second major surface;
    a tetrahedron comprising points A, B, C and D, wherein a first triangular facet is defined by sides extending between points A-B-D and the sides of the first facet at the point A subtend a first angle and the sides of the first facet at the point B subtend a second angle, wherein the first and second angles are equal to one another; a second triangular facet is defined by sides extending between points A-B-C and the sides of the second facet at the point A subtend a third angle and the sides of the second facet at the point B subtend a fourth angle, wherein the third and fourth angles are equal to one another, a third facet is defined by sides extending between points B-C-D, and a fourth facet is defined by sides extending between points A-C-D, and
    the sides of the first facet lie in a plane of the first major surface of the transparent substrate and surfaces of each of the second, third and fourth facets have a reflective surface,
    wherein the points A, B, C and D of the tetrahedron lie on X, Y, Z co-ordinances, wherein the X co-ordinance lies in a first plane, the Y co-ordinance lies in a second plane perpendicular to the first plane, and the Z co-ordinance lies in a third plane perpendicular to the first and the second planes, wherein points A, B, C and D of the tetrahedron lie on the X, Y, Z co-ordinances as follows:

| Points | Co-ordinances | | |
|---|---|---|---|
| | X | Y | Z |
| A | 0 | 0 | 0 |
| B | 1 | 0 | 0 |
| C | 0.5 | 0.8125 | 0 |
| D | 0.5 | 0.5 | 0.75. |

2. The transparency according to claim 1 wherein the first, second, third and fourth angles are equal to one another.

3. The transparency according to claim 1, wherein the transparency is a cover plate for a solar cell.

4. The transparency according to claim 1, wherein the sides of the first facet define an opening of a hole in the first major surface of the substrate and surfaces of the second, third and fourth facets are walls of the hole, wherein the walls of the hole are between the first and the second major surfaces of the substrate.

5. The transparency according to claim 4, wherein the tetrahedron is a first tetrahedron and comprising a second, third and fourth tetrahedron, wherein the second, third and fourth tetrahedrons each comprise the points A, B, C and D, wherein a first triangular facet of each one of the second, third and fourth tetrahedron is defined by sides extending between points A-B-D and the sides of the first facet at the point A of each of the second, third and fourth tetrahedron subtend a first angle and the sides of the first facet at the point B of each of the second, third and fourth tetrahedron subtend a second angle, wherein the first and second angles of each of the second, third and fourth tetrahedron are equal to one another; a second triangular facet is defined by sides extending between points A-B-C and the sides of the second facet at the point A of each of the second, third and fourth tetrahedron subtend a third angle and the sides of the second facet at the point B of each of the second, third and fourth tetrahedron subtend a fourth angle, wherein the third and fourth angles of each of the second, third and fourth tetrahedron are equal to one another; a third facet is defined by sides extending between points B-C-D of each of the second, third and fourth tetrahedron, and a fourth facet is defined by sides extending between points A-C-D of each of the second, third and fourth tetrahedron, and
    the sides of the first facet of each of the second, third and fourth tetrahedron lie in a plane of the first major surface of the transparent substrate and surfaces of each of the second, third and fourth facets of each of the second, third and fourth tetrahedron have a reflective surface, and
    wherein the side between the points A-B of the first tetrahedron and the side between the points B-A of the second tetrahedron overlay one another at the first major surface of the substrate; the side D-B of the first tetrahedron and the side between the points B-D of the third tetrahedron overlay one another at the first major surface of the substrate; and the side between the points B-D of the second tetrahedron and the side between the points D-B of the fourth tetrahedron overlay one another at the first major surface of substrate.

6. The transparency according to claim 5 wherein the first, second, third and fourth tetrahedrons form a first segment of the first major surface of the substrate, and comprising additional segments covering the remainder of the major surface of the substrate.

7. The transparency according to claim 5 wherein the transparency is selected from the group of a transparent office wall divider, a door window; a glass window; an automobile roof window; glass panels for a hot house; glass cover plates for outdoor lighting, and glass cover for a display.

8. The transparency according to claim 1, wherein the first facet is a portion of the first major surface of the substrate and the second, third and fourth facets are above and facing away from the substrate.

9. The transparency according to claim 8, wherein the tetrahedron is a first tetrahedron and comprising a second, third and fourth tetrahedron, wherein the second and third and fourth tetrahedrons each comprise the points A, B, C and D, wherein a first triangular facet of each one of the second, third and fourth tetrahedron is defined by sides extending between points A-B-D and the sides of the first facet at the point A of each of the second, third and fourth tetrahedron subtend a first angle and the sides of the first facet at the point B of each of the second, third and fourth tetrahedron subtend a second angle, wherein the first and second angles of each of the second, third and fourth tetrahedron are equal to one another; a second triangular facet is defined by sides extending between points A-B-C and the sides of the second facet at the point A of each of the second, third and fourth tetrahedron subtend a third angle and the sides of the second facet at the point B of each of the second, third and fourth tetrahedron subtend a fourth angle, wherein the third and fourth angles of each of the second, third and fourth tetrahedron are equal to one another, a third facet is defined by sides extending between points B-C-D of each of the second, third and fourth tetrahedron, and a fourth facet is defined by sides extending between points A-C-D of each of the second, third and fourth tetrahedron, and the sides of the first facet of each of the second, third and fourth tetrahedron lie in a plane of the first major surface of the transparent substrate and surfaces of each of the second, third and fourth facets of each of the second, third and fourth tetrahedron have a reflective surface, and wherein the side between the points A-B of the first tetrahedron and the side between the points B-A of the second tetrahedron overlay one another at the first major surface of the substrate; the side D-B of the first tetrahedron and the side between the points B-D of the third tetrahedron overlay one another at the first major surface of the substrate; and the side between the points B-D of the second tetrahedron and the side between the points D-B of the fourth tetrahedron overlay one another at the first major surface of substrate.

10. The transparency according to claim 9 wherein the first, second, third and fourth tetrahedrons form a segment of the first major surface of the substrate and comprising additional segments covering the remainder of the first major surface of the substrate.

11. A transparency for capturing internally reflected light, wherein the transparency comprises:
a transparent substrate having a first major surface and an opposite second major surface;
a tetrahedron comprising points E, F, G and H, wherein a first triangular facet is defined by sides extending between points E-F-H and the sides of the first facet at the point E subtend a first angle and the sides of the first facet at the point F subtend a second angle, wherein the first and second angles are equal to one another; a second triangular facet is defined by sides extending between points E-F-G and the sides of the second facet at the point E subtend a third angle and the sides of the second facet at the point F subtend a fourth angle, wherein the third and fourth angles are equal to one another, a third facet is defined by sides extending between points F-G-H, and a fourth facet is defined by sides extending between points E-G-H, and the sides of the first facet lie in a plane of the first major surface of the transparent substrate and surfaces of each of the second, third and fourth facets have a reflective surface, wherein the points E, F, G and H of the tetrahedron lie on X, Y, Z co-ordinances, wherein the X co-ordinance lies in a first plane, the Y co-ordinance lies in a second plane perpendicular to the first plane, and the Z co-ordinance lies in a third plane perpendicular to the first and the second planes, wherein points E, F, G and H of the tetrahedron lie on the X, Y, Z co-ordinances as follows:

| Points | Co-ordinances | | |
| --- | --- | --- | --- |
| | X | Y | Z |
| E | 0 | 0 | 0 |
| F | 1 | 0 | 0 |
| G | 0.5 | $\sqrt{3}/2$ | 0 |
| H | 0.5 | $\sqrt{3}/6$ | 0.42. |

12. The transparency according to claim 11, wherein the transparency is a cover plate for a solar cell.

13. The transparency according to claim 11, wherein the first major surface of the substrate lies in a plane and the triangular base of the tetrahedron pyramid lies in the plane, and the first, second and third triangular surfaces are between the first and the second major surfaces of the substrate.

14. The transparency according to claim 11, wherein the first major surface of the substrate and the triangular base of the tetrahedron pyramid lies in the first and the first, second and third triangular surfaces extend away from the first and the second major surfaces of the substrate.

15. The transparency according to claim 13 wherein the transparency is selected from the group of a transparent office wall divider; a door window; a glass window; an automobile roof window; glass panels for a hot house; glass cover plates for outdoor lighting, and glass cover for a display.

16. The transparency according to claim 11, wherein the first facet is a portion of the first major surface of the substrate and the second, third and fourth facets are above and facing away from the substrate.

17. The transparency according to claim 16, wherein the tetrahedron is a first tetrahedron and comprising a second, third and fourth tetrahedron, wherein the second and third and fourth tetrahedrons each comprise the points E, F, G and H, wherein a first triangular facet of each one of the second, third and fourth tetrahedron is defined by sides extending between points E-F-G; a second triangular facet is defined by sides extending between points E-G-H; a third facet is defined by sides extending between points E-F-H of each of the second, third and fourth tetrahedron, and a fourth facet is defined by sides extending between points F-G-H of each of the second, third and fourth tetrahedron, and the sides of the first facet of each of the second, third and fourth tetrahedron lie in a plane of the first major surface of the transparent substrate and surfaces of each of the second, third and fourth facets of each of the second, third and fourth tetrahedron have a reflective surface, and wherein the side between the points E-F of the first tetrahedron and the side between the points F-E of the second tetrahedron overlay one another at the first major surface of the substrate; the side E-G of the first tetrahedron and the side between the points G-E of the third tetrahedron overlay one another at the first major surface of the substrate; and the side between the points F-G of the second tetrahedron and the side between the points G-F of the fourth tetrahedron overlay one another at the first major surface of substrate.

18. The transparency according to claim 9 wherein the first, second, third and fourth tetrahedrons form a segment of the first major surface of the substrate and comprising additional segments covering the remainder of the first major surface of the substrate.

* * * * *